Figure 1:
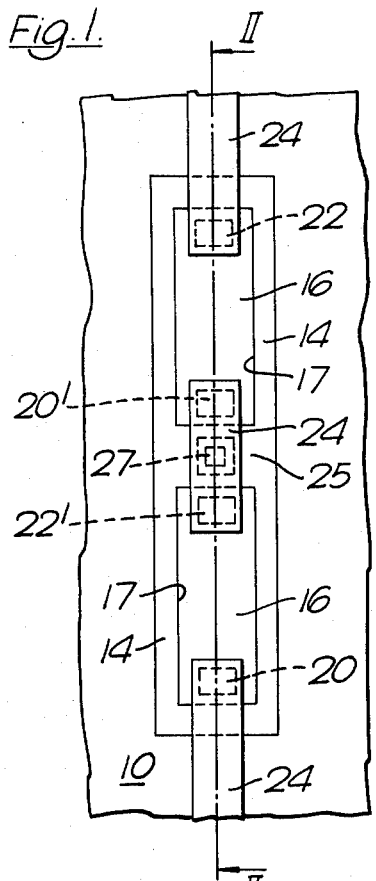

United States Patent [19]

Kane

[11] 4,223,335

[45] Sep. 16, 1980

[54] SEMICONDUCTOR DEVICE BODY HAVING IDENTICAL ISOLATED COMPOSITE RESISTOR REGIONS

[75] Inventor: Jeffrey Kane, Cheadle Hulme, England

[73] Assignee: Ferranti Limited, Hollinwood, England

[21] Appl. No.: 18,985

[22] Filed: Mar. 9, 1979

Related U.S. Application Data

[63] Continuation of Ser. No. 784,464, Apr. 4, 1977, abandoned.

[30] Foreign Application Priority Data

Aug. 2, 1975 [GB] United Kingdom ............... 32402/75

[51] Int. Cl.² ..................... H01L 27/04; H01L 29/12; H01L 27/02
[52] U.S. Cl. ........................................ 357/48; 357/47; 357/34; 357/36; 357/51
[58] Field of Search ....................... 357/34, 36, 47, 48, 357/51

[56] References Cited

U.S. PATENT DOCUMENTS

| | | | |
|---|---|---|---|
| 3,766,449 | 10/1973 | Bruchez | 357/36 |
| 3,818,463 | 6/1974 | Grundy | 357/48 |
| 3,827,034 | 7/1974 | Colaco | 357/48 |
| 3,922,707 | 11/1975 | Freed et al. | 357/48 |
| 3,946,425 | 3/1976 | Shoji et al. | 357/48 |
| 3,990,092 | 11/1976 | Yoshimura | 357/51 |
| 4,013,971 | 3/1977 | Sternbeck | 357/51 |
| 4,049,975 | 9/1977 | Colaco | 357/36 |
| 4,053,336 | 10/1977 | Grundy et al. | 357/48 |
| 4,161,742 | 7/1979 | Kane | 357/51 |

FOREIGN PATENT DOCUMENTS 1405285 9/1975 United Kingdom ..................... 357/34

*Primary Examiner*—Andrew J. James
*Attorney, Agent, or Firm*—Kerkam, Stowell, Kondracki & Clarke

[57] ABSTRACT

A resistor comprises two identical resistor regions with each resistor region isolated within the semiconductor body by a P-N junction, and with one electrode-bearing end of each resistor region both connected together and to a common region surrounding the resistor regions within the semiconductor body, so that the common surrounding region is to be at the same potential level as the mid-point of the resistor considered as a whole.

4 Claims, 3 Drawing Figures

SEMICONDUCTOR DEVICE BODY HAVING IDENTICAL ISOLATED COMPOSITE RESISTOR REGIONS

This is a continuation of application Ser. No. 784,464, filed Apr. 4, 1977 now abandoned.

This invention relates to semiconductor devices and has particular relevance to the formation of P-N junction isolated resistors in integrated circuit devices.

Each P-N junction isolated resistor usually comprises a P-N junction isolated resistor region of one conductivity type and of high resistivity material, surrounded within the semiconductor body by an associated region of the opposite conductivity type and of low resistivity material, the surrounding region comprising part of the resistor. The associated surrounding region usually is isolated within the semiconductor body from the remainder of the device.

It is desired to provide such a resistor in a monolithic semiconductor body of a semiconductor device as accurately as possible. However, because of inadvertent and unmeasurable variations of parameters and operating conditions throughout the semiconductor body, and because of inadequate control in the processing steps employed in fabricating such a device, it is difficult to provide sufficiently accurately for some applications the required resistance under normally encountered operating conditions for the device.

Predictable variations in the operating characteristics of the resistor, and in the parameters and the operating conditions throughout the semiconductor body, conveniently, may be compensated for when designing the semiconductor device.

Unpredictable variations of the resistance at least partially are caused by inadvertent and unpredictable variations of the voltage-resistance operating characteristic, and possibly also of other operating characteristics of the resistor, and of the normally-encountered operating conditions to which the resistor is subjected.

It is an object of the present invention to provide a semiconductor device in a monolithic semiconductor body, the device having a resistor with a construction having associated therewith smaller inadvertent and unpredictable variations of at least the voltage-resistance operating characteristic than otherwise would be the cause, and possibly also with which the effects of the inadvertent and unpredictable variations in the operating characteristics of the resistor are reduced, and possibly also the effects of unpredictable variations in the normally-encountered operating conditions to which the resistor is subjected are reduced.

It is another object of the present invention to provide a semiconductor device in a monolithic semiconductor body, the device having a resistor with a construction suitable for satisfactory dual polarity mode of operation i.e. a resistor end electrode potential may be either more positive or more negative than the potential of the other resistor end electrode, and yet the device is still capable of operating satisfactorily, it being equally unlikely that any part of the P-N junction isolating the resistor will become forward biassed to an extent more than is acceptable.

According to the present invention a semiconductor device in a semiconductor body is connected to a source of electrical potential, the device includes a resistor comprising two identical resistor regions, with each resistor region isolated within the semiconductor body from other regions of the device by at least a P-N junction between the resistor region and an associated surrounding region of low resistivity material common to both resistor regions, one electrode-bearing end of each resistor region are connected together and are connected to the surrounding region, and the source of electrical potential is connected to the other electrode-bearing end of one resistor region.

According to another aspect, the present invention comprises a semiconductor device in a semiconductor body including a resistor comprising two identical resistor regions, individually isolated within the semiconductor body by a P-N junction, and a common associated surrounding region of low resistivity material, the isolating P-N junctions being between the resistor regions and the associated surrounding region, and one electrodebearing end of each resistor region are connected together and are connected to the surrounding region.

Figure 2:
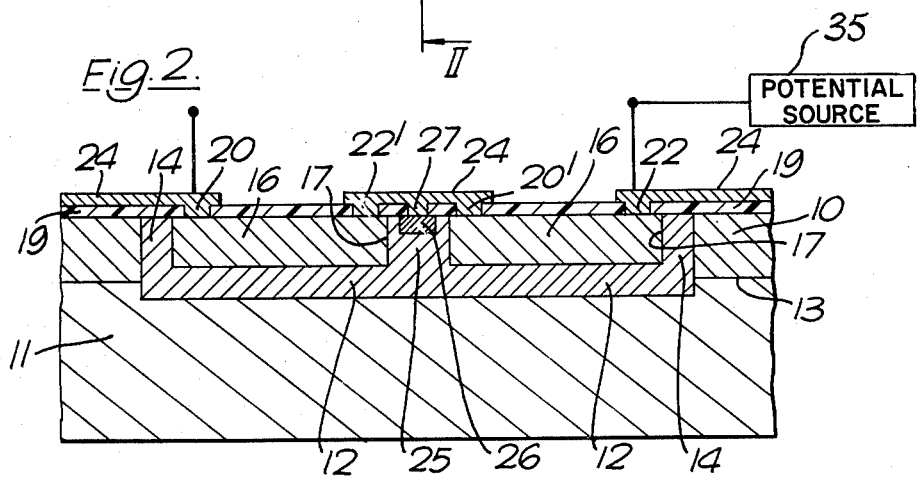
Figure 3:
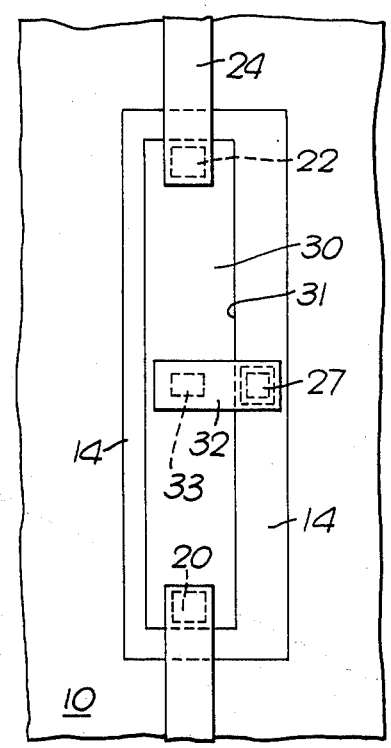

One embodiment of the invention will now be described by way of example with reference to the accompanying drawings, in which, FIG. 1 is a plan view of part of an integrated circuit device embodying a centre-tapped resistor comprising one embodiment in accordance with the present invention, FIG. 2 is a section on the line II—II of FIG. 1, and FIG. 3 is a plan view, corresponding to that of FIG. 1, but of another embodiment of a centre-tapped resistor according to the present invention.

The resistor illustrated in FIGS. 1 and 2 has a construction closely resembling the known, so-called collector-diffusion isolation (CDI) bipolar transistor, and may be formed in a semiconductor body by the same processing steps as those required to provide the transistor.

The semiconductor body of the integrated circuit device comprises a P type epitaxial layer 10 on a P type substrate 11. The resistor includes a buried N type layer 12 provided at a portion of the interface 13 between the epitaxial layer 10 and the substrate 11. An N type isolation barrier 14 for the resistor extends through the epitaxial layer 10 to contact the buried N type layer 12. There is thus defined a resistor region 16 comprising an unmodified region of the P type epitaxial layer. The resistivity value of the material of the resistor region 16 is higher than that of the N type material of the buried layer 12 and the isolation barrier 14. The combination of the isolation barrier 14 and the buried layer 12 comprises a surrounding region for the resistor region 16, and a P-N junction 17 isolating the resistor region is between the surrounding region 12, 14 and the resistor region 16. The surrounding region 12, 14 is isolated within the semiconductor body from the remainder of the device. In FIG. 1 a passivating layer 19 of silicon oxide is omitted for the sake of clarity, but apertures through the passivating layer for electrodes on the passivating layer to contact the silicon semiconductor body therebeneath are indicated by continuous lines, as also are the surface portions of P-N junctions, except where they extend beneath the electrodes and electrical connections for the electrodes, where they are indicated by dotted lines. Buried layers within the semiconductor body also are not indicated in FIG. 1.

Electrodes 20 and 22 are provided at opposite ends of the resistor region 16. The electrodes extend through apertures in the passivating layer 19 from electrical connections 24.

According to the present invention the resistor has two identical resistor regions 16, and a common surrounding region 12, 14 is provided. A portion 25 of the surrounding region extends between arms of the isolation barrier 14, and between the constituent resistor regions. A heavily doped N type electrode contact region 26 is provided in the portion 15 to facilitate connecting an electrode 27 to the surrounding region.

Under normal operating conditions for the integrated circuit device either electrode bearing end of the resistor becomes more positive than the other electrode bearing end of the resistor. If the electrodes 20' and 22' at the opposing ends of the resistor regions are connected together, the resistor end electrodes 20 and 22 are spaced from these electrodes 20' and 22', and the electrodes 20' and 22' are at a potential level midway between those of the electrodes 20 and 22. Further, as illustrated, the electrodes 20' and 22' are connected to the electrode 27 to the surrounding region, and the whole of the surrounding region is at this intermediate potential level.

For a CDI type structure it is undesirable that any part of a P-N junction 17 should become forward biassed with an applied potential difference of more than 200 mV.

There is a tendency, because the resistance-voltage coefficients of the two resistor regions, one being of opposite sense with respect to the other, for these coefficients to cancel each other, so that the resistor considered as a whole has a much lower resistance-voltage coefficient than would otherwise be the case, and hence inadvertent and unpredictable variations in this characteristic are smaller than otherwise would be the case.

In addition, the bias potential across difference parts of each P-N junction 17 is half what would otherwise be the case.

At least partially, for these reasons, and because of the uniformity of construction of the two resistor regions, the effects of inadvertent and unpredictable variations in the operating characteristics of the resistor may be reduced, and possibly also the effects of inadvertent and unpredictable variations in the normally-encountered operating conditions to which the resistor is subjected may be reduced.

Hence, it is possible to provide a required resistance in a monolithic semiconductor body, under normally-encountered operating conditions for the device, more accurately than otherwise would be the case.

Further, the resistor construction is suitable for dual polarity mode of operation. Thus, the potential of a resistor end electrode 20 and 22 may be set more positive or more negative than the potential of the other resistor end electrode by connecting thereto a potential source 35 and it is equally unlikely that any part of the P-N junctions 17 isolating the resistor regions will become forward biassed to an extent more than is acceptable. For the dual polarity mode of operation a potential difference of up to 400 mV can be applied between the ends of the CDI type resistor structure.

The centre-tapped resistor construction shown in FIG. 3 comprises a modification to that shown in FIGS. 1 and 2, and parts of the construction of FIG. 3 identical to or closely resembling corresponding parts of the construction of FIGS. 1 and 2 are identified by the same reference numerals.

As shown in FIG. 3 the modified CDI type resistor structure comprises a unitary resistor region 30, isolated within the semiconductor by a P-N junction 31, and is divided into two identical constituent resistor regions by providing a contact 32 at the mid-point of the region 30. The P-N junction 31 is between the resistor region 30 and a common surrounding region 14. The contact 32 extends through an aperture 33 in the layer of passivating material, and comprises a contact at opposing ends of each of the two identical constituent resistor regions of the region 30. Thus, the contact 32 connects the two identical resistor regions together. In addition, the contact 32 is connected to an electrode 27 to the heavily doped common surrounding region 14, so that the region 14 is at the potential level of the mid-point of the resistor considered as a whole, as with the embodiment of FIGS. 1 and 2. The two constituent resistor regions have substantially the same construction, but are not as inherently uniform as the resistor regions provided by the construction of FIGS. 1 and 2.

The surrounding region is required to be isolated within the semiconductor body by a P-N junction or a dielectric layer.

The resistor may have any convenient construction, and may comprise a pinch resistor.

The resistor according to the present invention may be provided in an integrated circuit device described and claimed in our copending patent application Serial No. 710748, having different substantially matched resistor with constituent substantially matched resistor parts.

What I claim is:

1. A semiconductor device in a semiconductor body, the device comprising: a composite resistor comprising first and second resistor regions, an associated region of low resistivity material surrounding said resistor and forming with said composite resistor a P-N junction, said material having a resistivity less than that of said resistor, electrode means connected to one end of each of said first and second resistor regions and connected to said surrounding associated region, and a source of electrical potential of a given value is connected to the other end of one of said first and second resistor regions, whereby a potential of a fraction of said given value is applied by said electrode means to said surrounding region, said fraction selected to tend to reduce the effects of the resistance-voltage coefficients of said resistor.

2. A semiconductor device as claimed in claim 1 in which said first and second resistor regions are parts of a unitary resistor region having a midpoint, said electrode means comprising an electrode to connect said constituent first and second resistor regions to said surrounding region at said mid-point of said unitary resistor region, and said electrode means overlying a portion of said P-N junction between said unitary resistor region and said common surrounding region at said mid-point of said unitary resistor region.

3. A semiconductor device in a semiconductor body, said device comprising:
   (a) a composite resistor comprising first and second identical resistor regions, individually isolated within said semiconductor body by a P-N junction;
   (b) an associated region surrounding both resistor regions and made of a resistivity material having a resistivity less than that of said first and second resistor regions;
   (c) said isolating P-N junctions being disposed between said resistor and said associated surrounding region;

(d) electrode means for connecting together one each of each of said first and second resistor regions and for connecting said ends to said associated surrounding region; and
(e) a source of a given value of electrical potential being connected to another end of one of said first and second resistor regions, whereby a potential of a fraction of said given value is applied by said electrode means to said associated surrounding region.

4. A semiconductor device in a semiconductor body, said device comprising:

(a) a composite resistor comprising first and second identical resistor regions, individually isolated within said semiconductor body by a P-N junction;
(b) a common associated region surrounding said resistor and made of a resistivity material having a resistivity less than that of said resistor;
(c) said isolating P-N junction being disposed between said resistor and said associated surrounding region; and
(d) electrode means for connecting one end of each of said first and second resistor regions together and to said associated surrounding region and for applying a potential to said associated surrounding region of a value of substantially one-half of that applied to an end of one of said first and second identical resistor regions.

* * * * *